(12) United States Patent
Villa et al.

(10) Patent No.: US 10,930,799 B2
(45) Date of Patent: Feb. 23, 2021

(54) SEMICONDUCTOR DIE WITH BURIED CAPACITOR, AND METHOD OF MANUFACTURING THE SEMICONDUCTOR DIE

(71) Applicant: STMicroelectronics S.r.l., Agrate Brianza (IT)

(72) Inventors: Flavio Francesco Villa, Milan (IT); Marco Morelli, Bareggio (IT); Marco Marchesi, Piacenza (IT); Simone Dario Mariani, Vedano Al Lambro (IT); Fabrizio Fausto Renzo Toia, Busto Arsizio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 2 days.

(21) Appl. No.: 16/246,945

(22) Filed: Jan. 14, 2019

(65) Prior Publication Data
US 2019/0221678 A1 Jul. 18, 2019

(30) Foreign Application Priority Data
Jan. 15, 2018 (IT) ........................ 102018000000947

(51) Int. Cl.
*H01L 29/94* (2006.01)
*H01L 29/66* (2006.01)
(Continued)

(52) U.S. Cl.
CPC ........ *H01L 29/945* (2013.01); *H01L 27/0629* (2013.01); *H01L 28/60* (2013.01);
(Continued)

(58) Field of Classification Search
CPC ............. H01L 29/945; H01L 27/10829; H01L 27/10861
See application file for complete search history.

(56) References Cited

U.S. PATENT DOCUMENTS

| | | | |
|---|---|---|---|
| 6,060,758 A * | 5/2000 | Ravanelli ............ | H01L 27/0248 257/373 |
| 6,437,385 B1 * | 8/2002 | Bertin ............... | H01L 27/10861 257/301 |

(Continued)

OTHER PUBLICATIONS

IT Search Report and Written Opinion for IT Appl. No. 102018000000947 dated Sep. 10, 2018 (9 pages).
(Continued)

*Primary Examiner* — Eugene Lee
(74) *Attorney, Agent, or Firm* — Crowe & Dunlevy

(57) ABSTRACT

A semiconductor body includes a front side and a back side and is configured to support an electronic circuit. A buried region is provided in the semiconductor body at a location between the electronic circuit and the back side. The buried region includes a layer of conductive material and a dielectric layer, where the dielectric layer is arranged between the layer of conductive material and the semiconductor body. A conductive path extends between the buried region and the front side to form a path for electrical access to the layer of conductive material. A capacitor is thus formed with the layer of conductive material providing a capacitor plate and the dielectric layer providing the capacitor dielectric. A further capacitor plate is provided by the semiconductor body, or by a further layer of conductive material in the buried region.

13 Claims, 14 Drawing Sheets

(51) Int. Cl.
    *H01L 27/06*     (2006.01)
    *H01L 49/02*     (2006.01)
    *H01L 21/02*     (2006.01)

(52) U.S. Cl.
    CPC .... *H01L 29/66181* (2013.01); *H01L 21/0265* (2013.01); *H01L 21/02639* (2013.01)

(56) References Cited

U.S. PATENT DOCUMENTS

| | | | | |
|---|---|---|---|---|
| 7,378,692 | B2* | 5/2008 | Delpech | H01L 21/76264 257/288 |
| 8,173,513 | B2 | 5/2012 | Villa et al. | |
| 8,587,064 | B2* | 11/2013 | Warabino | H01L 23/3677 257/288 |
| 2003/0116798 | A1 | 6/2003 | Park | H01L 29/945 257/301 |
| 2005/0176211 | A1* | 8/2005 | Fukuzaki | H01L 27/10832 438/386 |
| 2007/0099391 | A1* | 5/2007 | Cheng | H01L 27/1087 438/400 |
| 2008/0048231 | A1 | 2/2008 | Ei-Kareh | |
| 2009/0174031 | A1* | 7/2009 | Wang | G11C 11/404 257/532 |
| 2009/0176347 | A1 | 7/2009 | Cheng et al. | |
| 2010/0117612 | A1* | 5/2010 | Klootwijk | H01L 27/0805 323/282 |
| 2017/0221901 | A1 | 8/2017 | Baskaran et al. | |
| 2017/0250253 | A1 | 8/2017 | Toia et al. | |

OTHER PUBLICATIONS

"Embedded Memory: The All-Purpose Core", EDN Electrical Design NEWS. (Texas Instrument), Reed Business Information, Highlands Ranch, CO, US, Mar. 13, 1998 (12 pages).

Lu N. C. C. et al: "A buried-trench dram cell using a self-aligned epitaxy over trench technology" International Electron Devices Meeting . San Francisco, Dec. 11-14, 1988 International Electron Devices Meeting. New York, IEEE, US.

S. Armbruster et al., "A novel micromachining process for the fabrication of monocrystalline Si-membranes using porous silicon", Transducers'03, The 12th International Conference on Solid State Sensors, Actuators and Microsystems, Boston, Jun. 8-12 2003, vol. 1, pp. 246-249.

T. Sato, N. Aoki, I. Mizushima and Y. Tsunashima, "A New Substrate Engineering for the Formation of Empty Space in Silicon (ESS) Induced by Silicon Surface Migration", IEDM 1999, pp. 517-520.

Tsutomu Sato, et al., "Fabrication of Silicon-on-Nothing Structure by Substrate Engineering Using the Empty-Space-in-Silicon Formation Technique", Japanese Journal of Applied Physics, vol. 43, No. 1, 2004, pp. 12-18.

\* cited by examiner

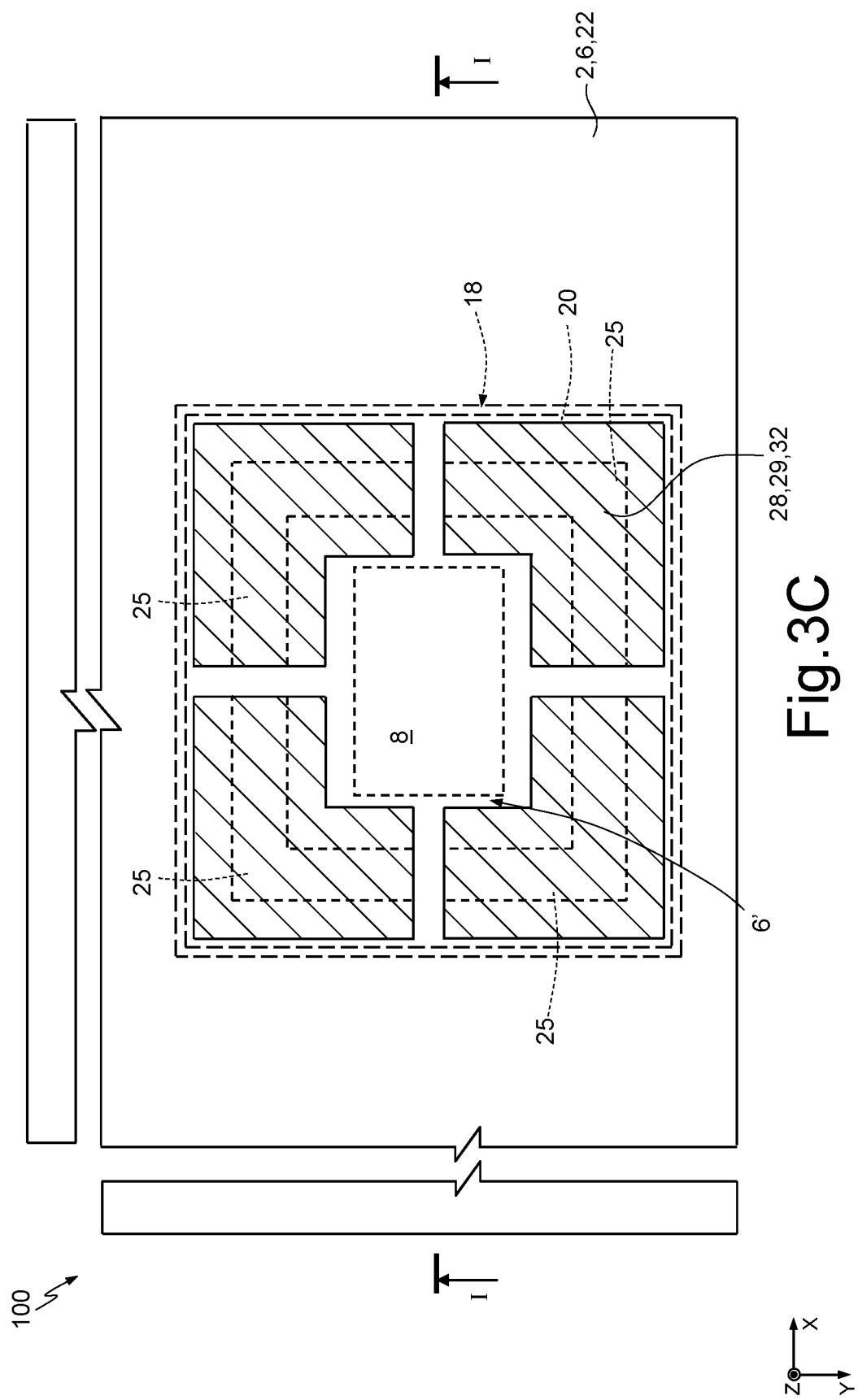

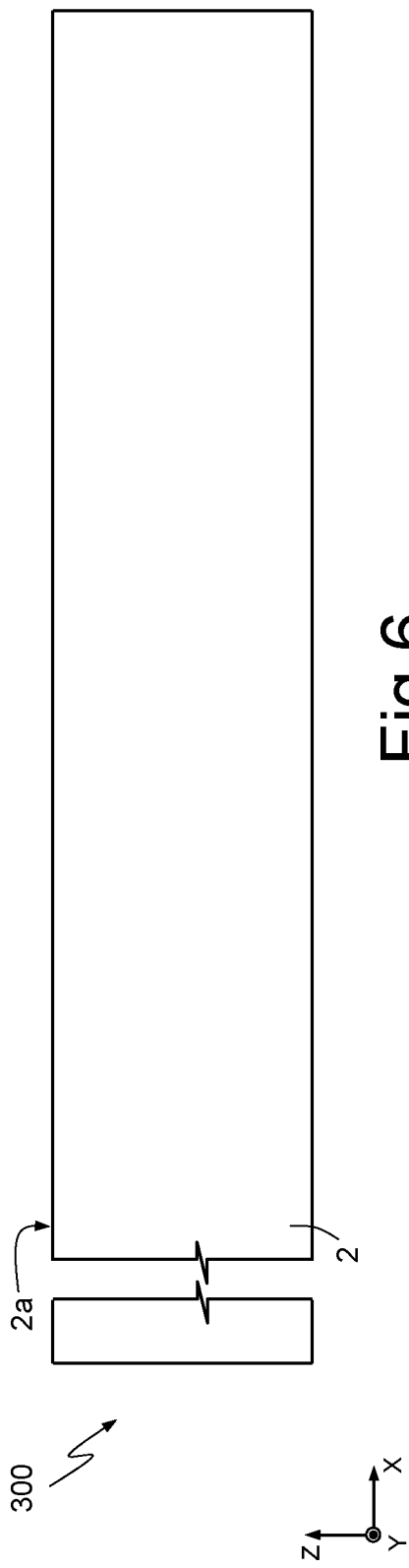
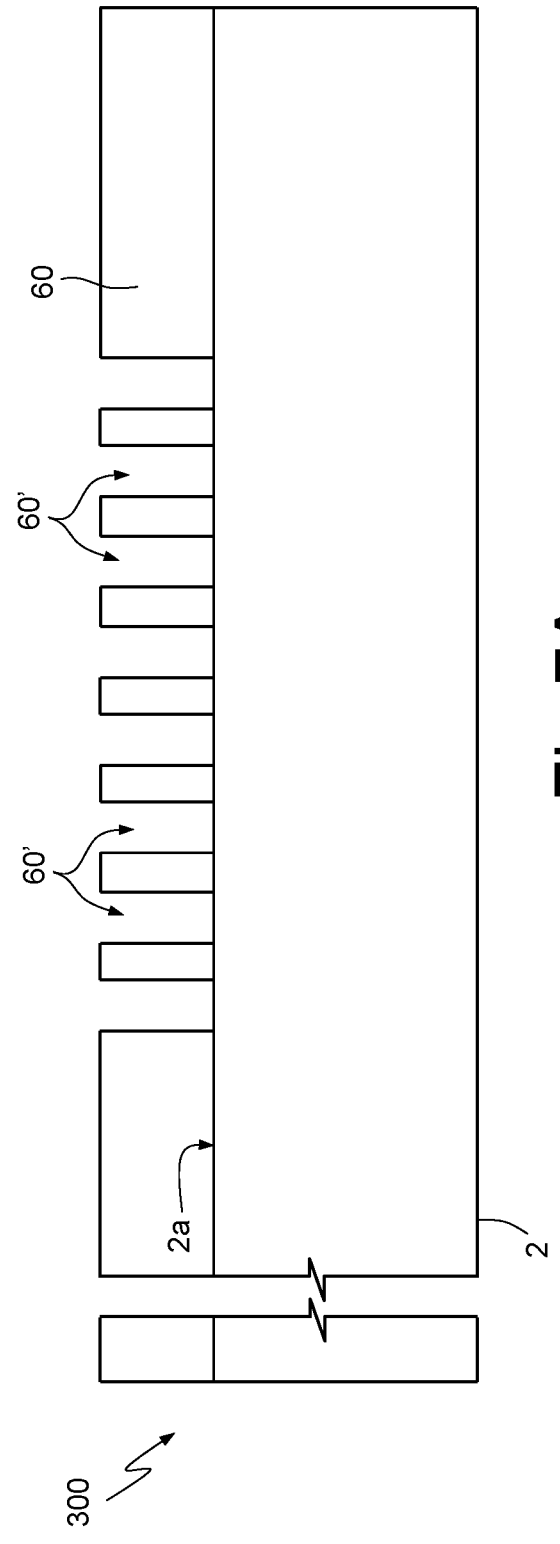

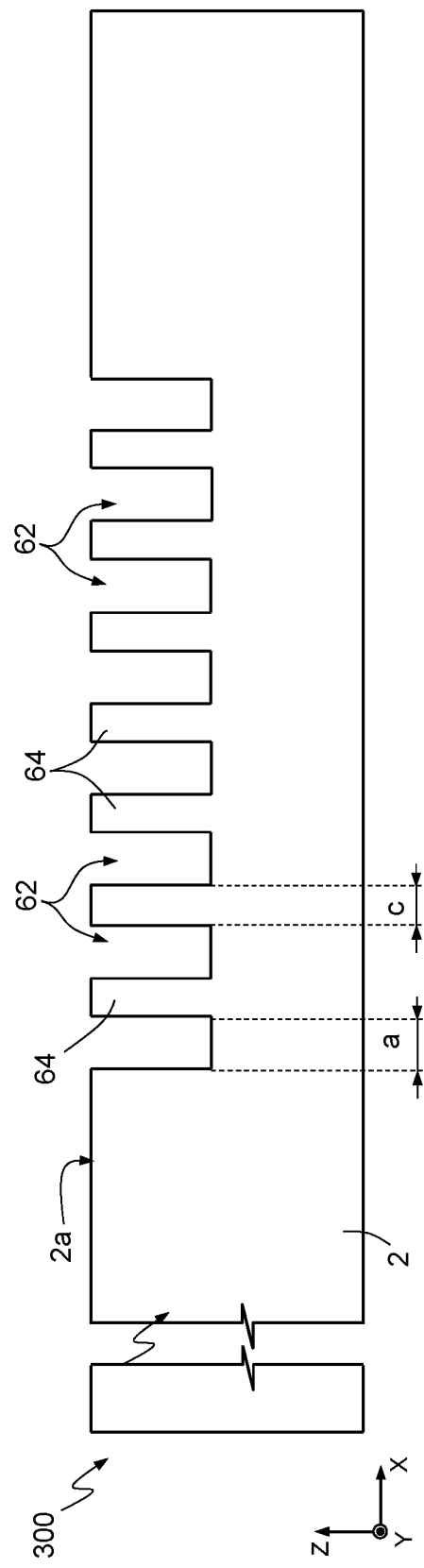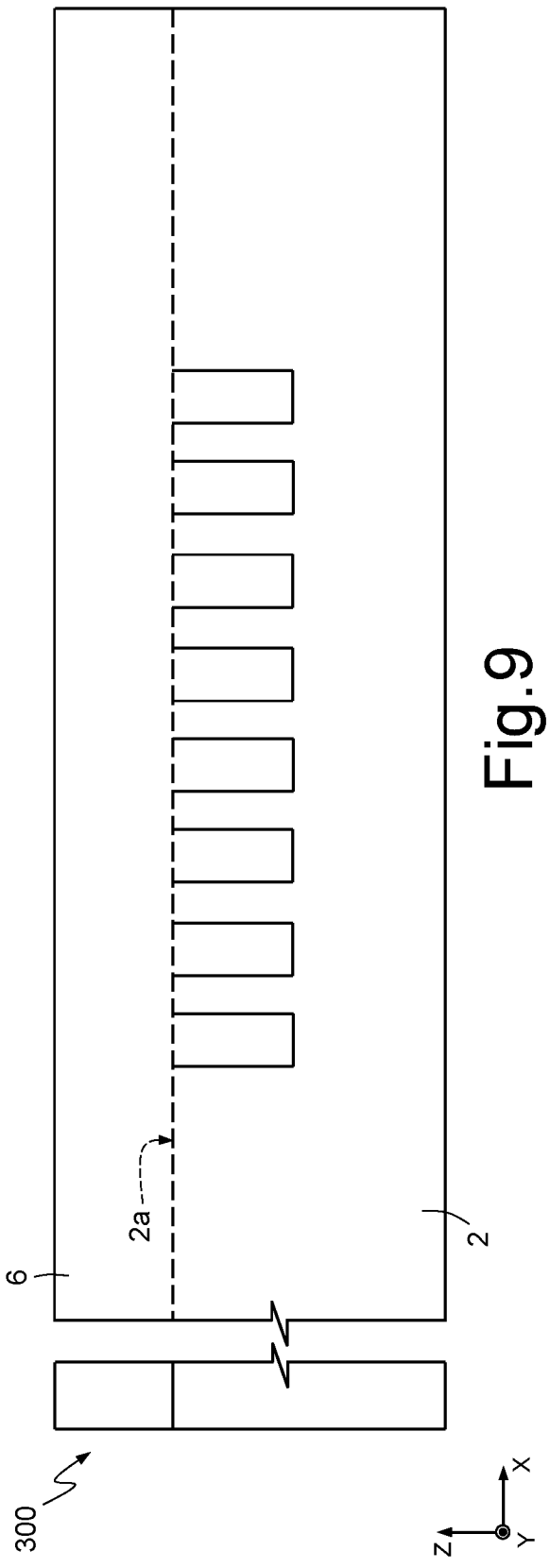

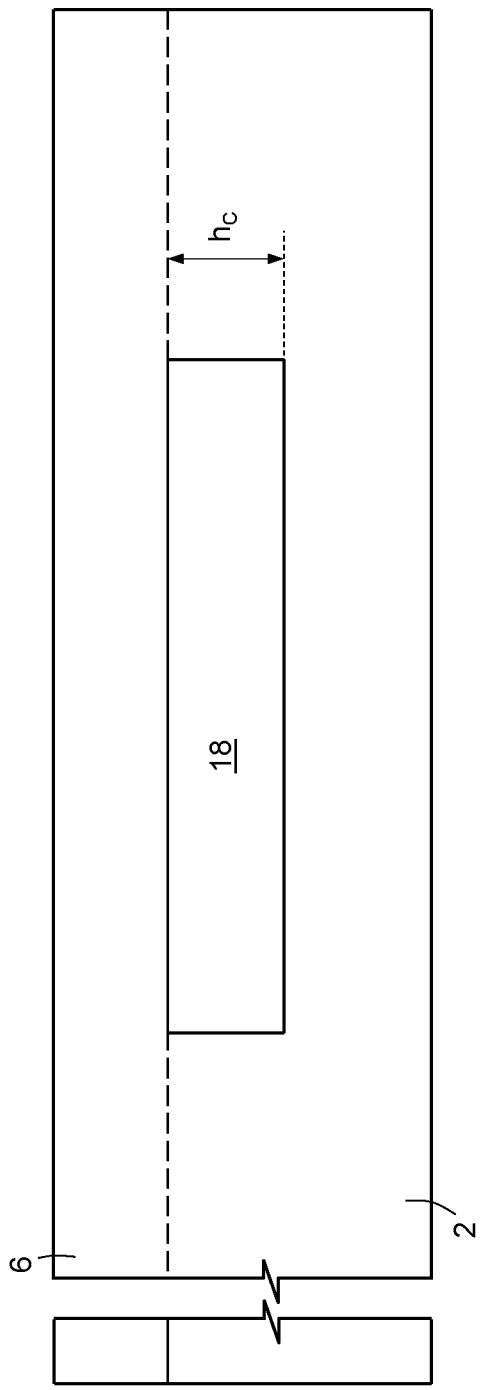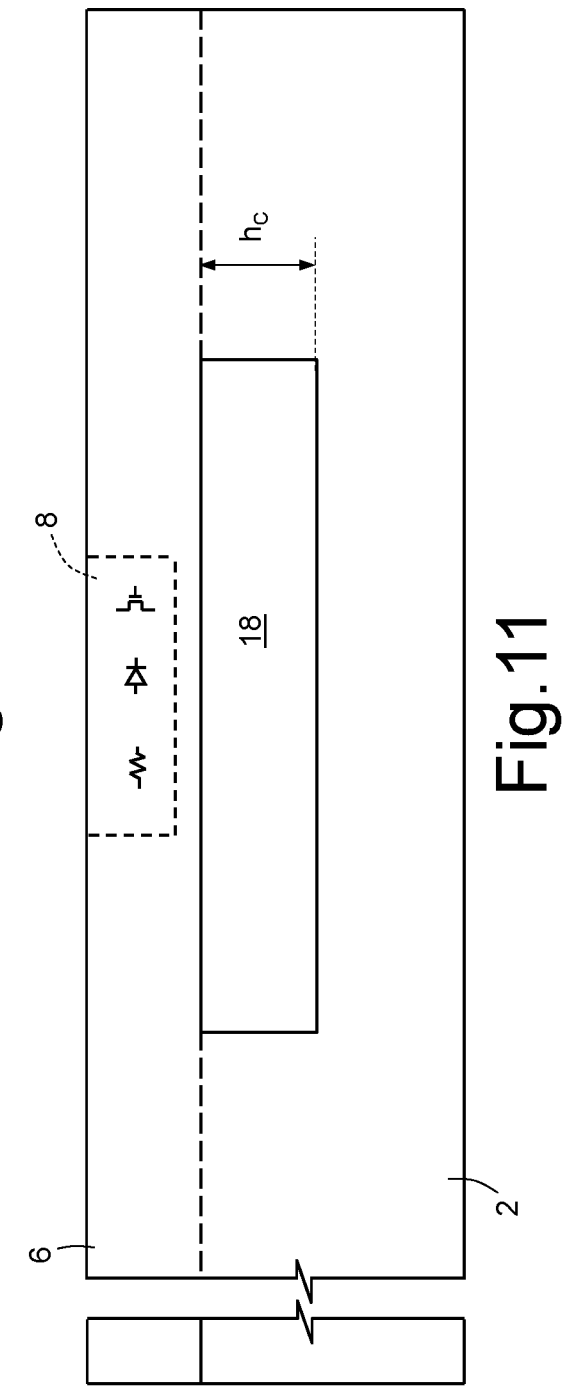

SEMICONDUCTOR DIE WITH BURIED CAPACITOR, AND METHOD OF MANUFACTURING THE SEMICONDUCTOR DIE

PRIORITY CLAIM

This application claims the priority benefit of Italian Application for Patent No. 102018000000947, filed on Jan. 15, 2018, the content of which is hereby incorporated by reference in its entirety to the maximum extent allowable by law.

TECHNICAL FIELD

The present disclosure relates to a semiconductor die with buried capacitor, and to a method of manufacturing the semiconductor die.

BACKGROUND

Capacitors are components of primary importance in integrated circuits. In order to meet different requirements of circuit applications, various types of capacitors have been proposed, each with characteristics of their own. On account of the limited capacitance per unit area, capacitors generally occupy a considerable area within the integrated circuit to which they belong. Selecting one type of capacitor over another is thus a fundamental aspect in the design of integrated circuits.

Known in the art are basically three types of capacitors, namely, metal-oxide-semiconductor (MOS) capacitors, metal-insulating-metal (MIM) capacitors, and metal-oxide-metal (MOM) capacitors. Of these, owing to their thin gate-oxide structure, MOS capacitors have the highest value of density of capacitance per unit area. However, they suffer from considerable disadvantages, such as an accentuated not-linearity, a high temperature coefficient and a low breakdown voltage, which render them not suitable for all circuit applications. MIM and MOM capacitors overcome the disadvantages of MOS capacitors; however, the densities of capacitance of said MIM and MOM capacitors are considerably lower as compared to MOS capacitors. Consequently, the use of MIM and MOM capacitors entails a higher consumption of area.

As a consequence of what has been discussed above, in many applications it is preferable to use discrete capacitors external to the integrated circuit (e.g., SMD capacitors).

There is accordingly a need for capacitors that enable the critical aspects of capacitors of a known type to be overcome and at the same time enable a saving of area.

SUMMARY

In an embodiment, an integrated circuit comprises: a semiconductor body having a front side and a back side; an electronic circuit in the semiconductor body; a buried region in the semiconductor body between the electronic circuit and the back side, the buried region including a first layer of conductive material and a dielectric layer arranged between the first layer of conductive material and the semiconductor body; and a first conductive path between the buried region and the front side which forms a path for electrical access to the first layer of conductive material, wherein said first layer of conductive material forms a first plate of a capacitor buried in the semiconductor body and the dielectric layer forms a dielectric of said capacitor.

In an embodiment, an integrated circuit comprises: a semiconductor substrate; an epitaxial semiconductor layer over the semiconductor substrate; wherein the semiconductor substrate includes a cavity which is covered by the epitaxial semiconductor layer; a capacitor dielectric layer lining walls of the cavity; a conductive material at least partially filling the cavity and insulated from the semiconductor substrate and the epitaxial semiconductor layer by the capacitor dielectric layer, wherein the conductive material at least partially filling the cavity forms a first plate of a capacitor and the semiconductor substrate forms a second plate of the capacitor.

In an embodiment, an integrated circuit comprises: a semiconductor substrate; an epitaxial semiconductor layer over the semiconductor substrate; wherein the semiconductor substrate includes a cavity which is covered by the epitaxial semiconductor layer; an insulating layer lining walls of the cavity; a first conductive material lining the insulating layer in the cavity; a capacitor dielectric layer lining surfaces of the first conductive material in the cavity; a second conductive material lining surfaces of the capacitor dielectric layer in the cavity, wherein the first conductive material forms a first plate of a capacitor and the second conductive material forms a second plate of the capacitor.

In an embodiment, a method of manufacturing an integrated circuit comprises: forming a buried cavity in a semiconductor body; etching selective portions of the semiconductor body until the buried cavity is reached to form one or more openings which have access to the buried cavity; depositing dielectric material within the buried cavity through the one or more openings so as to completely coat inner walls of the buried cavity to form a dielectric layer; and depositing conductive material within the buried cavity through the one or more openings so as to completely coat the dielectric layer and forming a first layer of conductive material, wherein said first layer of conductive material forms a first plate of a capacitor buried in the semiconductor body and the dielectric layer provides a dielectric of said capacitor.

In an embodiment, a method of manufacturing an integrated circuit comprises: forming a buried cavity in a semiconductor body; etching selective portions of the semiconductor body until the buried cavity is reached to form one or more openings which have access to the buried cavity; forming an insulating layer within the buried cavity by one of a deposition or a thermal growth so as to completely coat inner walls of the buried cavity; depositing conductive material within the buried cavity through the one or more openings so as to completely coat the insulating layer and forming a first layer of conductive material; depositing a layer of dielectric material within the buried cavity so as to completely cover the first layer of conductive material and form a dielectric layer; and depositing conductive material within the buried cavity through the one or more openings in order to completely coat the dielectric layer and form a second layer of conductive material, wherein said first layer of conductive material forms a first plate of a capacitor buried in the semiconductor body, the dielectric layer provides a dielectric of said capacitor and said second layer of conductive material forms a second plate of a capacitor buried in the semiconductor body.

BRIEF DESCRIPTION OF THE DRAWINGS

For a better understanding of the present invention, preferred embodiments thereof are now described, purely by way of non-limiting example, with reference to the attached drawings, wherein:

FIGS. 3A-3C show, in top plan view, the semiconductor die of FIG. 1 according to respective layouts;

FIGS. 6-14 show a wafer during manufacturing steps for the production of the semiconductor die of FIG. 1.

DETAILED DESCRIPTION

Figure 1:
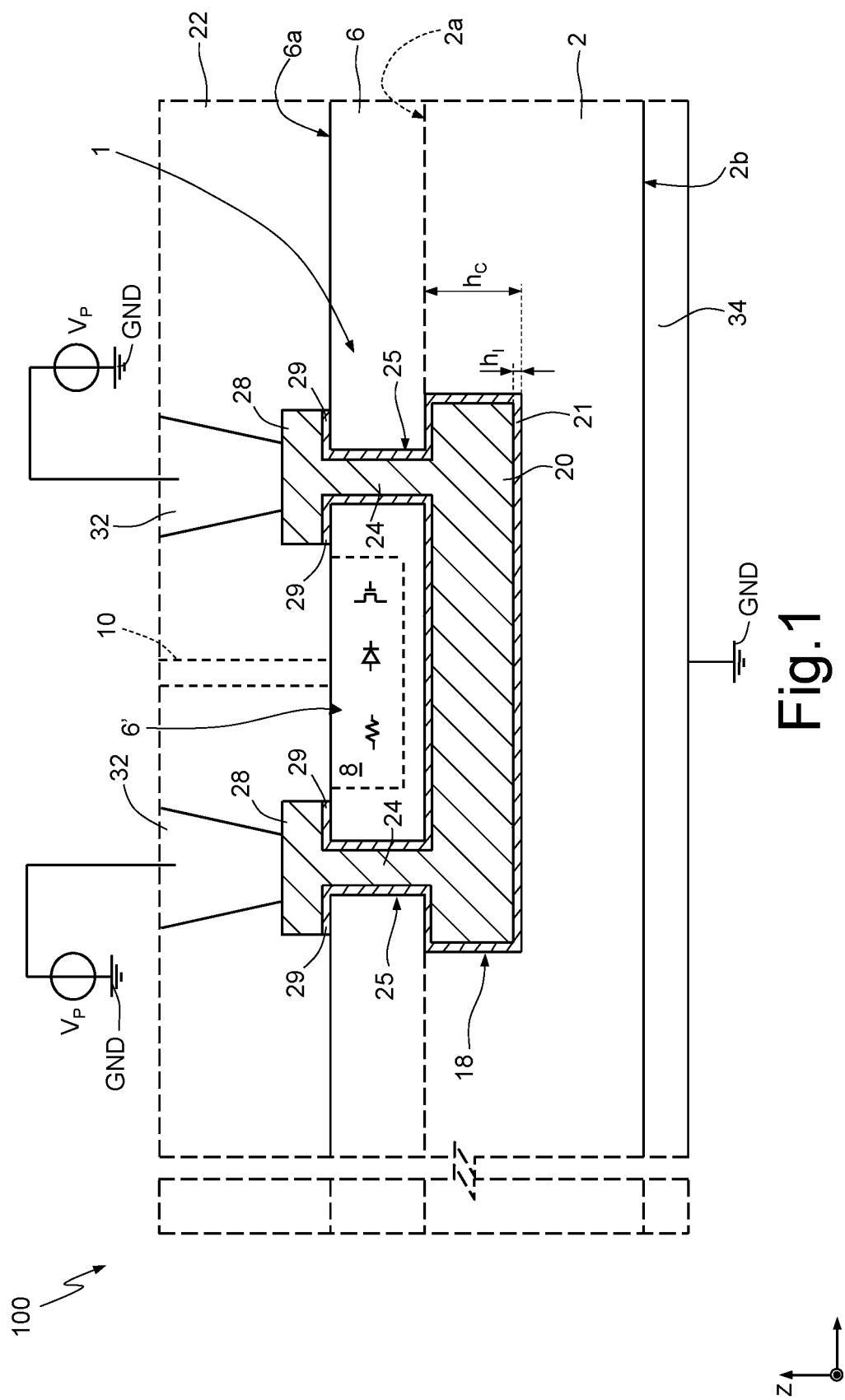
FIG. 1 shows, in lateral sectional view, a semiconductor die with buried capacitor, according to one embodiment.

FIG. 1 is a schematic lateral sectional view, in a triaxial system X, Y, Z, of a portion of a die, or chip, 100 that houses an integrated semiconductor device, in particular including a capacitor 1, according to one aspect of the present invention. The view of FIG. 1 is a cross-sectional view taken along the line of section I-I of FIGS. 3A-3C. The capacitor 1 is of an integrated type, or embedded, in the die 100.

The die 100 comprises a semiconductor substrate 2, made, for example, of silicon, having a first conductivity (e.g., of a P type) and having a top surface 2a opposite, along Z, to a bottom surface 2b. By way of example, the semiconductor substrate 2 is doped with a concentration of P dopant species comprised between $10^{15}$ and $10^{18}$ at./cm$^3$. In the context of this embodiment, the die 100 may likewise be provided, on the top surface 2a of the substrate 2, with one or more epitaxial layers 6, which are also of semiconductor material, for example silicon, and have the first conductivity, for an overall thickness, along Z, for example comprised between 10 μm and 100 μm.

The die 100 further comprises a buried conductive region 20 extending in the substrate 2 (and possibly, in part, in the epitaxial layer 6), of doped polysilicon or of metal material or a metal alloy. Examples of materials that may be used include, but not are limited to, Ru, Pt, Ir, Pd, Ag, Au, W, Cu, Co, Fe, Ni, Mo, Ta, Ti, Al, doped Si, doped Ge, etc.

According to the embodiment illustrated in FIG. 1, the buried conductive region 20 is electrically insulated from substrate 2, and from the epitaxial layer 6, by a layer of dielectric material 21, made, for example, of silicon oxide. According to one aspect, the layer of dielectric material 21 is made of a material with high dielectric constant k (known in the art as "high-k material"). Materials that may be used include, but not are limited to, $Al_2O_3$, $TiO_2$, $GeO_2$, $Si_3N_4$, $La_2O_3$, etc.

In an embodiment provided by way of example, the buried cavity 18 has, in top plan view in the plane XY, a shape chosen from among circular, oval, quadrangular, or generically polygonal, with a diameter comprised approximately between 10 μm and 1 mm and a base area comprised between 10 μm$^2$ and 1 mm$^2$. Alternatively, in a way not illustrated in FIG. 1, it is likewise possible to form a plurality of membranes adjacent to one another, to form a suspended surface with total base area (sum of the areas of the adjacent membranes) of several square millimeters, according to the need. The extension (depth or thickness) $h_C$ of the buried cavity 18 in the direction Z is comprised approximately between 2 μm and 10 μm. The layer of dielectric material 21 has a substantially uniform thickness $h_I$; for example, it may be an atomic monolayer or may be formed by thousands of atomic monolayers arranged on top of one another. The buried conductive region 20 has, in top plan view in the plane XY, a shape and size defined by the buried cavity 18 and by the layer of dielectric material 21.

The buried conductive region 20 is formed, according to one aspect of the present disclosure, in a buried cavity 18 in the semiconductor substrate 2. The walls of the buried cavity 18 are completely covered by the dielectric 21, and extending over the dielectric layer 21, inside the buried cavity 18, is the buried conductive region 20. The buried conductive region 20 may fill the buried cavity 18 completely and uniformly (FIG. 1) or else only partially (FIG. 2), to define a hollow region 23 inside the buried conductive region 20 that is completely surrounded by the buried conductive region 20. The embodiment of FIG. 1 enables a better dissipation of heat as compared to the embodiment of FIG. 2.

The presence or otherwise of one or more cavities internal to the buried conductive region 20 may likewise depend upon the filling method used.

The buried conductive region 20 is connected to the top surface of the epitaxial layer 6a by one or more electrical paths 24, which have a main extension along Z. The electrical paths 24 are provided in trenches 25 that extend starting from the buried conductive region 20, through part of the semiconductor substrate 2 and through the entire thickness of the epitaxial layer 6, towards the top surface 6a of the epitaxial layer 6. The electrical paths 24 are made of conductive material, for example polysilicon or metal, in particular of the same material as the one used for forming the buried conductive region 20 (as will be described more fully in what follows; according to one embodiment, they may be formed simultaneously with the buried conductive region 20).

Figure 2:
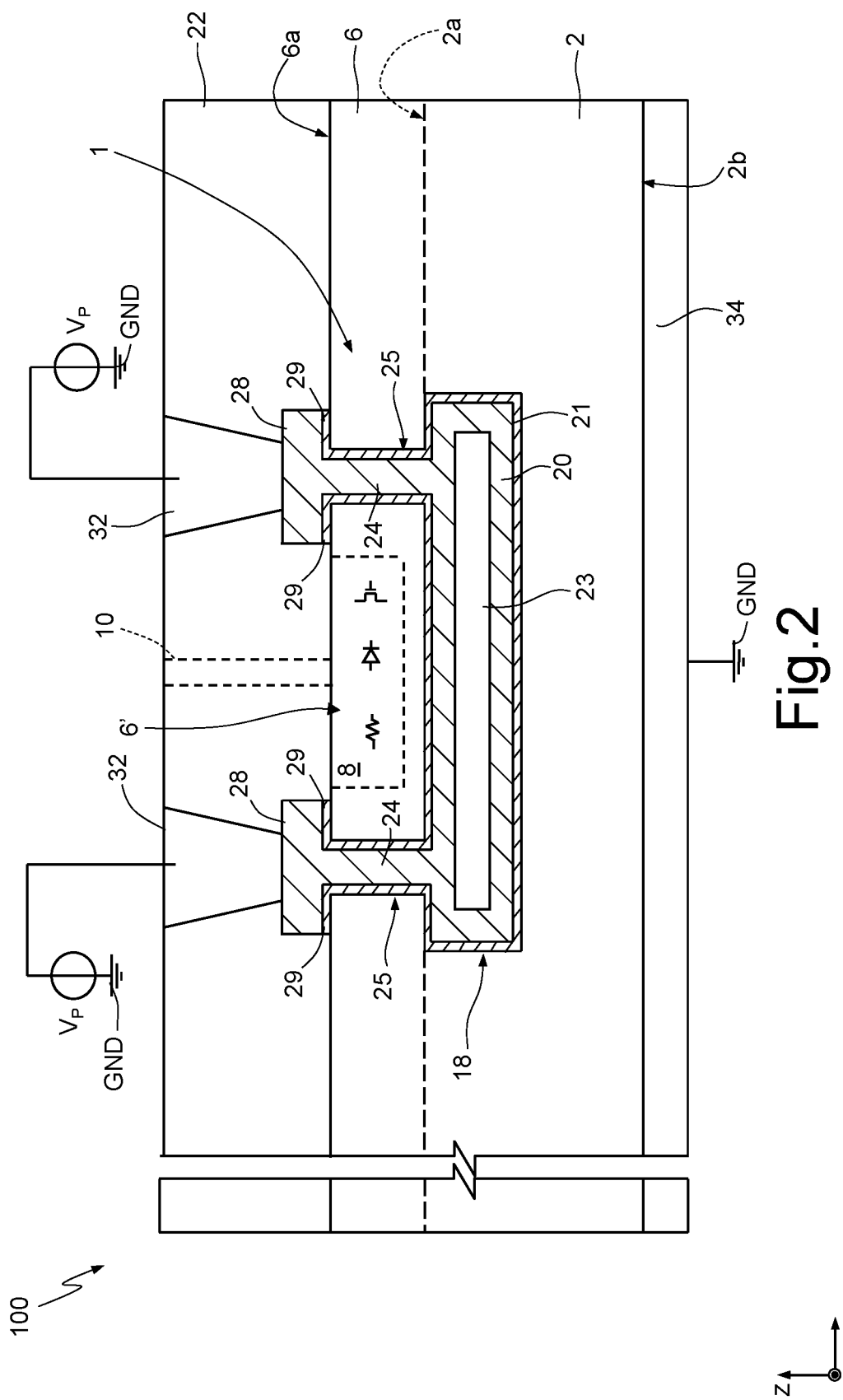
FIG. 2 shows, in lateral sectional view, a semiconductor die with buried capacitor, according to a further embodiment.

Furthermore, an insulating layer, formed as prolongation of the dielectric 21, extends on the inner walls of the trenches 25 to insulate the electrical paths 24 electrically from the substrate 2 and from the epitaxial layer 6. In the embodiment of FIGS. 1 and 2, as described in greater detail in what follows, the insulating layers internal to the trenches 25 are made in the same manufacturing step as the dielectric 21 and are consequently identified by the same reference number.

In order to prevent any possible undesired contamination of the epitaxial layer 6 and of the substrate 2 by the filling metal material of the buried cavity 18 and of the trenches 25, it is possible to carry out, prior to the step of formation of the dielectric 21, a step of formation of a barrier layer (not illustrated in the figures) designed to prevent diffusion of metal ions within the epitaxial layer 6 and the substrate 2.

The electrical paths 24 are electrically connected to conductive paths 28, which extend on the top surface 6a of the epitaxial layer 6. The conductive paths 28 are further electrically insulated from the epitaxial layer 6 by interposition of a dielectric or insulating layer 29. In an embodiment, the dielectric layer 29 extends on the top surface 6a as a prolongation of the dielectric 21, whereas the conductive paths 28 extend on the dielectric layer 29 as a prolongation of the buried conductive region 20.

The die 100 further comprises a pre-metal dielectric (PMD) layer 22 made, for example, of silicon oxide, which extends over the top surface 6a of the epitaxial layer 6.

The pre-metal dielectric layer 22 may, for example, be made of silicon oxide and have a thickness chosen according to the need, for example comprised approximately between 0.5 μm and 3 μm.

For electrical access to one or more conductive paths 28, one or more conductive trenches 32 extend through the pre-metal dielectric layer 22, until the one or more conductive paths 28 are electrically contacted.

Extending on a bottom surface 2b of the substrate 2, opposite to the top surface 2a of the substrate 2, is a back electrical-contact region 34, made, for example, of conductive material, such as a metal.

In use, the buried conductive region 20 has the function of first plate of the capacitor 1, which may be biased at a working voltage $V_P$ by the conductive trench 32, the conductive path 28 coupled thereto, and the corresponding electrical path 24. The substrate 2 forms a second plate of the capacitor 1, which may be biased at a respective working voltage by the back electrical contact 34. In the example of FIGS. 1 and 2, the working voltage applied on the back electrical contact 34 is the ground voltage GND.

The dielectric 21 that extends between the buried conductive region 20 and the substrate 2 forms a dielectric of the capacitor 1 arranged between the first and second plates.

According to an aspect, the epitaxial layer 6 houses, in a region 6', one or more electronic components, in particular designed and coupled to one another to form an electronic circuit 8. The region 6' is a region that extends over the cavity 18 (i.e., the region 6' and the cavity 18 are superimposed on one another in top plan view). The electronic components that form the electronic circuit 8 may include active components such as transistors (e.g., MOS transistors, DMOS transistors, VDMOS transistors, trench-MOS transistors, bipolar transistors, etc.), or else passive components such as resistors and/or diodes, or in general any other electronic component. Electrical-connection paths 10 (only one of which is illustrated in the figures) form respective electrical paths for supplying/picking up electrical signals to/from the electronic circuit 8. The region that houses the electronic circuit 8 is an active region of the die 100, in which phenomena of transport and conduction of electric charge take place.

Figure 3A:
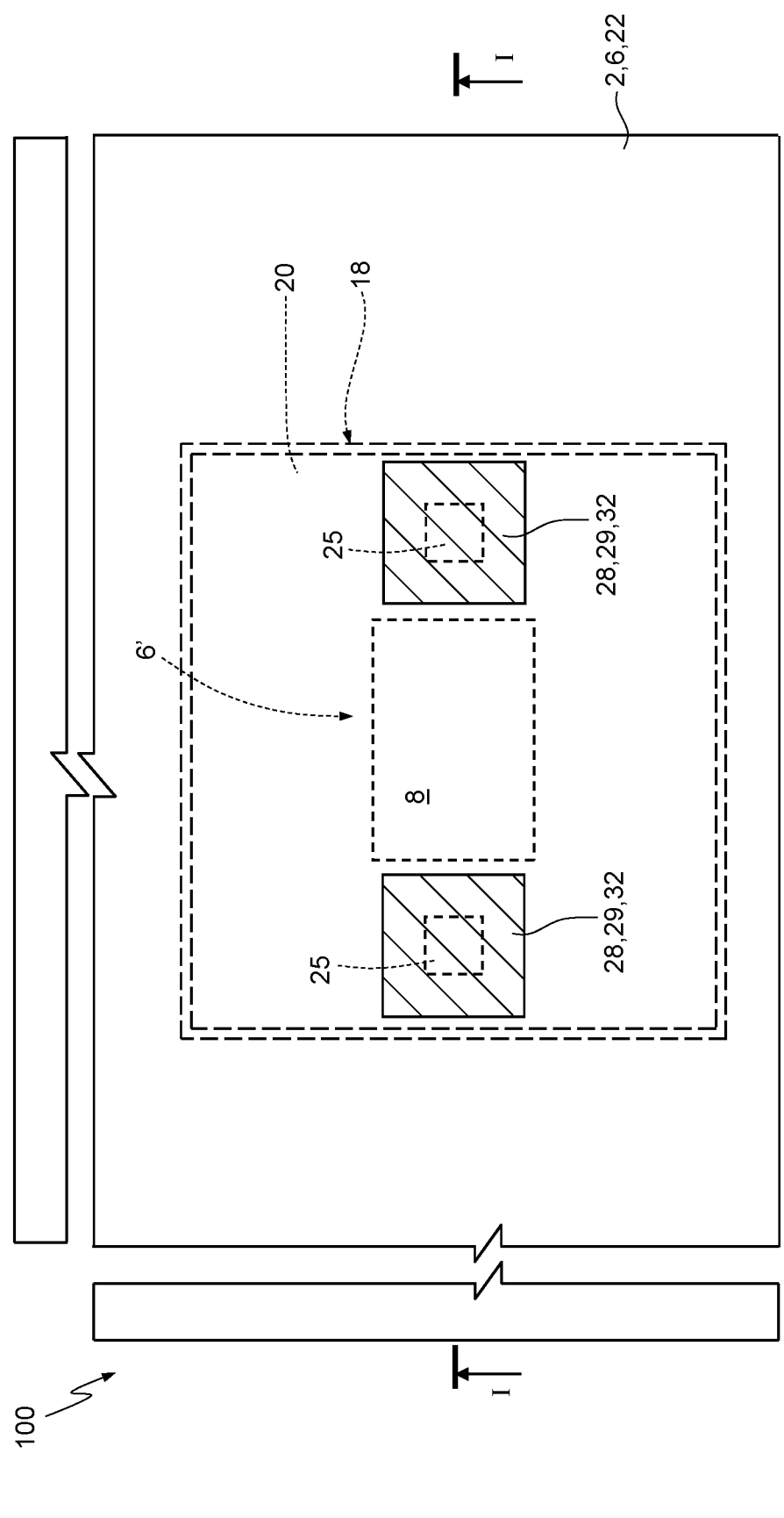
Figure 3B:
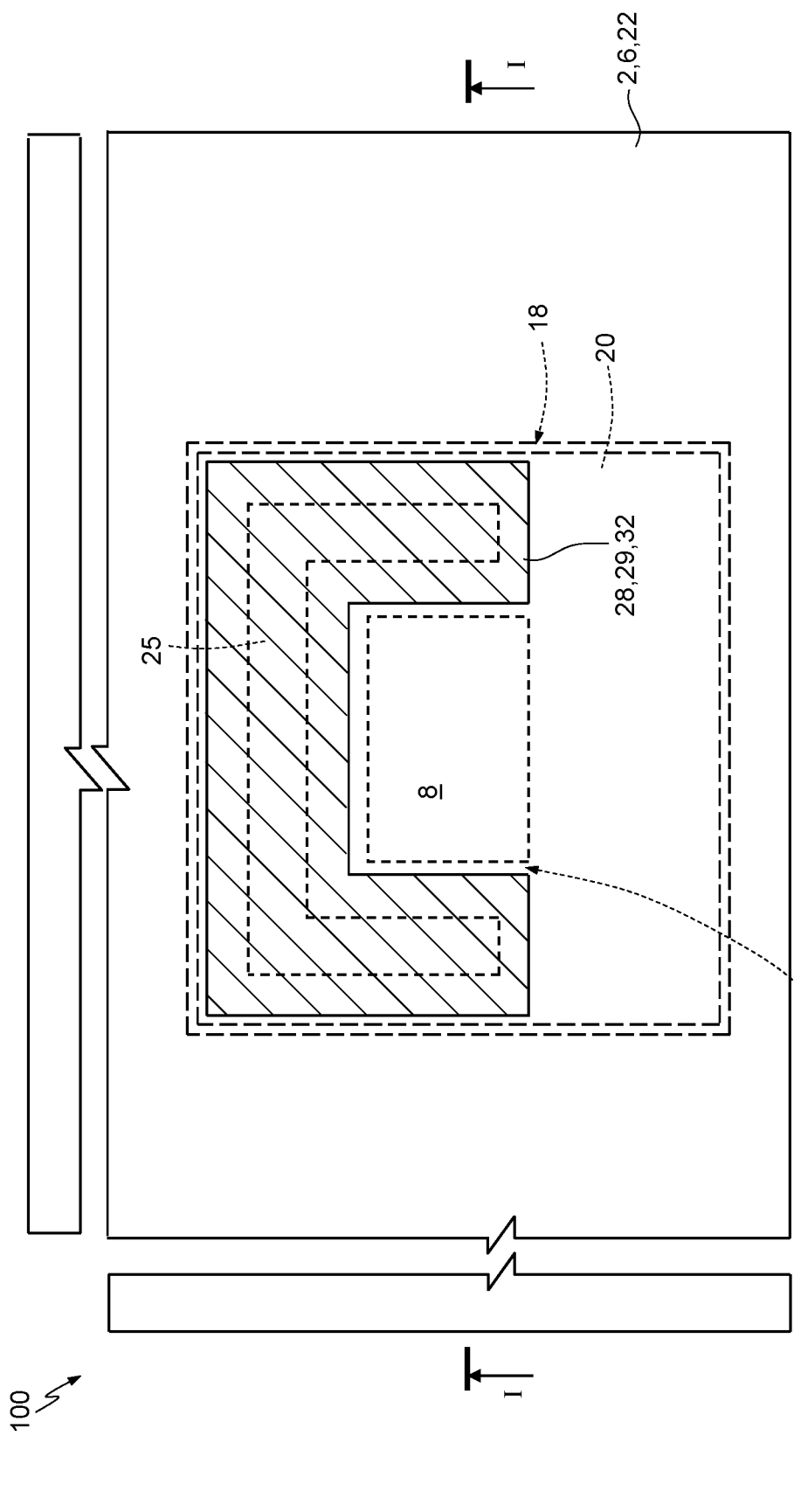

FIGS. 3A-3C illustrate in top plan view in the plane XY, limited to showing the elements of interest, respective layouts of the die 100 of FIGS. 1 and 2.

With reference to FIG. 3A, a plurality of trenches 25 are present (here, two, but the number may be any as selected by the designer), coupled to respective conductive paths 28, each of which providing a point of electrical access for biasing the buried conductive region 20. The region 6' that houses the electronic circuit 8 extends, in this example, between the trenches 25.

With reference to FIG. 3B, a single trench 25, which is U-shaped, is present. Likewise, a conductive path 28 extends in a position corresponding to the trench 25 and substantially follows the shape thereof in plan view, as does the conductive trench 32. This embodiment presents the advantage of providing a greater area of electrical contact for biasing the buried conductive region 20, consequently reducing the series resistance. The region 6' that houses the electronic circuit 8 is, in this example, partially surrounded by the trench 25.

In an embodiment not illustrated, two U-shaped trenches 25 may be present, which are specular to one another with respect to an axis parallel to the direction X.

In a further embodiment, which is not shown either, there may be present one or more trenches that have a substantially rectangular shape, with a main extension along the axis X and/or along the axis Y.

FIG. 3C illustrates a further embodiment in which a plurality of trenches 25 are present, which partially surround the electronic circuit 8.

Figure 4:
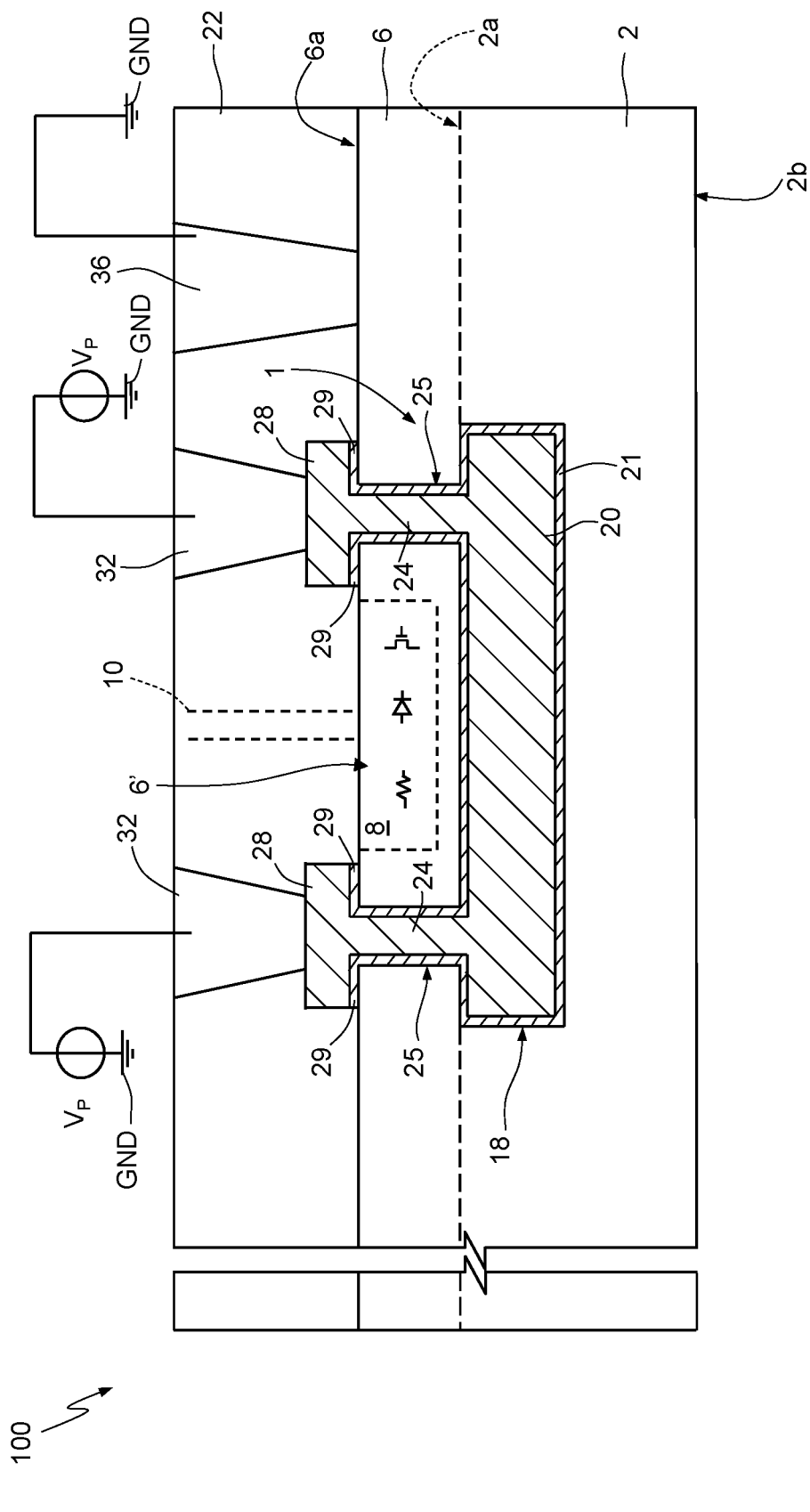
FIGS. 4 and 5 show, in lateral sectional view, respective semiconductor dice with buried capacitor, according to respective further embodiments.

FIG. 4 shows the die 100 in a further embodiment. Here, the back electrical contact 34 is not present, and a conductive via 36 extends through the pre-metal dielectric layer 22 until the epitaxial layer 6, and via the epitaxial layer 6 the substrate 2, is reached and electrically contacted at its top surface 6a, at a distance from the conductive paths 28. In a way similar to what has been described previously, the buried conductive region 20 forms a first plate of the capacitor 1, the dielectric 21 forms a dielectric arranged between the plates of the capacitor 1, and the substrate 2 forms a second plate of the capacitor 1.

Figure 5:
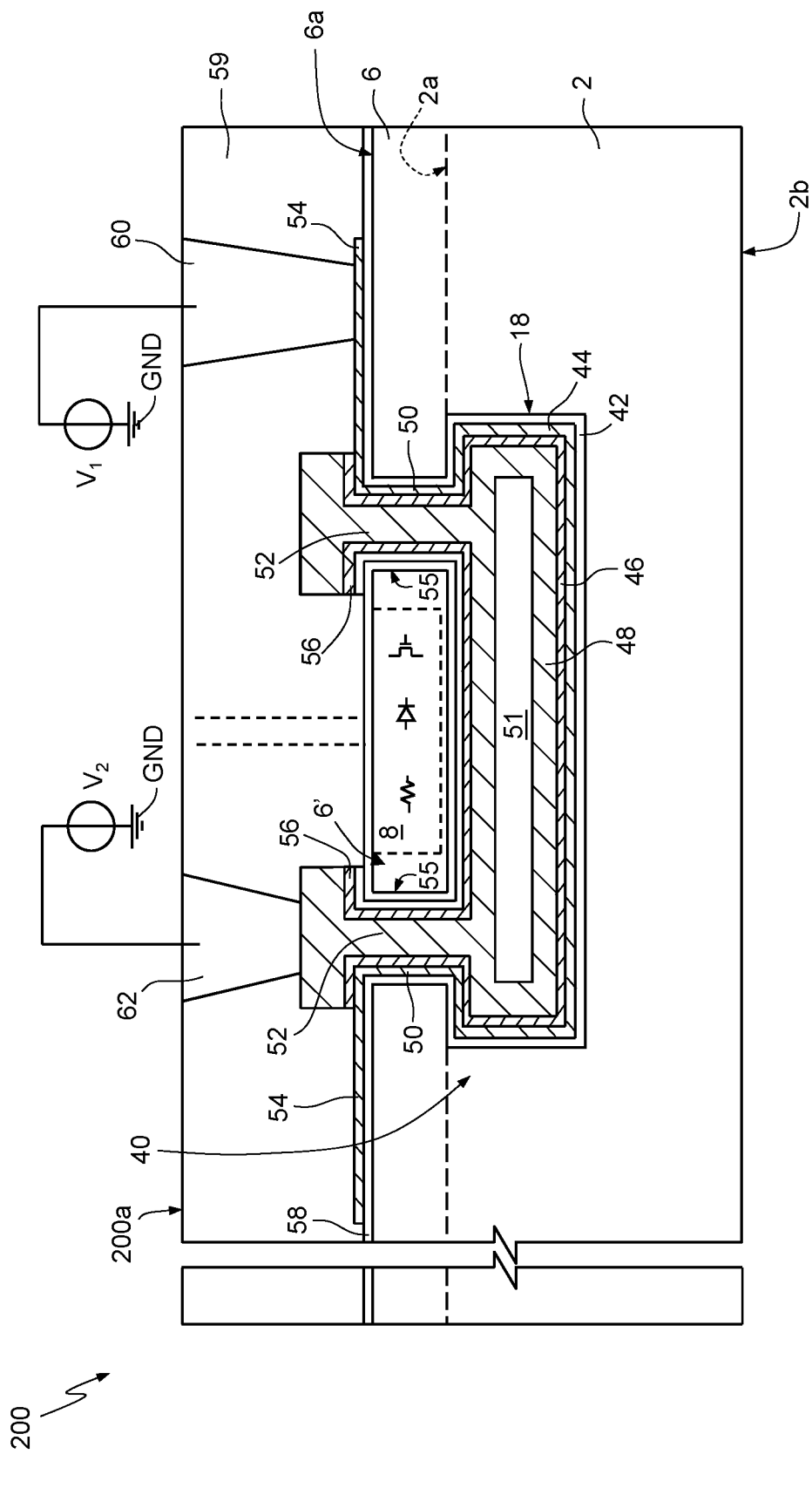

FIG. 5 is a schematic lateral-sectional view, in the triaxial system X, Y, Z, of a portion of a die 200, in particular integrating a capacitor 40, according to a further embodiment.

In a way similar to what has been described with reference to FIGS. 1 and 2 (the same reference numbers identify elements that are in common) the die 200 comprises a semiconductor substrate 2 extending on which is an epitaxial layer 6, both being, for example, of an N type; likewise extending in the substrate 2 is a buried cavity 18. Extending in the buried cavity 18, and in particular on the internal wall of the buried cavity 18, is an insulating region 42, made, for example, of silicon oxide.

Extending on the insulating region 42, inside the buried cavity 18, is a first conductive region 44, made, for example, of doped polysilicon, or else of metal or a metal alloy. Examples of materials that may be used include, but are not limited to, Ru, Pt, Ir, Pd, Ag, Au, W, Cu, Co, Fe, Ni, Mo, Ta, Ti, Al, doped Si, doped Ge, etc. The first conductive region 44 is completely insulated from the substrate 2 by the insulating region 42.

Extending on the first conductive region 44, in the buried cavity 18, is a dielectric region 46, in particular a dielectric with a high dielectric constant k (known in the art as "high-k material"). Materials that may be used include, but are not limited to, $Al_2O_3$, $TiO_2$, $GeO_2$, $Si_3N_4$, $La_2O_3$, etc. $SiO_2$ may alternatively be used.

Finally, extending on the dielectric region 46 is a second conductive region 48, made, for example, of doped polysilicon, metal, or a metal alloy. The materials referred to previously for the first conductive region 44 may be used also in this case. The second conductive region 48 is completely insulated from the first conductive region 44 by the dielectric region 46. In other words, the dielectric region 46 is arranged between the first and second conductive regions 44, 48.

In the embodiment of FIG. 5, the second conductive region 48 delimits within it a hollow portion 51. In a different embodiment (not illustrated here but like that shown in FIG. 1), the second conductive region 48 may fill the hollow portion 51 completely, the latter thus not being present.

The first and second conductive regions 44, 48 are electrically accessible by respective first and second electrical paths 50, 52, which extend, substantially in the direction Z, in trenches 55 formed through the epitaxial layer 6 and in part through the semiconductor substrate 2. The first and second electrical paths 50, 52 are made, for example, of doped polysilicon, or metal material, in particular of the same material as the one used for formation of the first and second conductive regions 44, 48. Further, it may be noted that the insulating region 42 extends through the trenches 55, in contact with the inner walls of the trenches 55, between the substrate 2/epitaxial layer 6 and the first electrical path 50, so as to insulate electrically the first electrical path 50 from the substrate 2/epitaxial layer 6. Likewise, also the dielectric region 46 extends through the trenches 55, between the first electrical path 50 and the second electrical path 52, for electrically insulating the first electrical path 50 from the second electrical path 52. In this way, the first and second conductive regions 44, 48 are electrically accessible independently of one another.

In order to prevent any possible undesired contamination of the epitaxial layer 6 and of the substrate 2 by the filling metal material of the buried cavity 18 and of the trenches 55, it is possible to carry out, prior to the step of formation of the insulating region 42, a step of formation of a barrier layer (not illustrated in the figures) designed to prevent diffusion of metal ions within the epitaxial layer 6 and the substrate 2.

The first and second electrical paths 50, 52 are electrically coupled to respective first and second conductive paths 54, 56 that extend above the epitaxial layer 6, insulated from the latter by an insulating layer 58, which extends as a prolongation of the portion of the insulating region 42 inside the trenches 55 (this is, according to one aspect, a single layer formed in a same manufacturing step; according to an alternative aspect, the insulating layer 58 could be formed in a different manufacturing step).

The die 200 further comprises a pre-metal dielectric (PMD) layer 59, made, for example, of silicon oxide, which extends on the top surface 6a of the epitaxial layer 6, coating the first and second conductive paths 54, 56.

The pre-metal dielectric layer 22 may, for example, be made of silicon oxide and have a thickness chosen according to the need, for example comprised between 0.5 µm and 3 µm.

Finally, first and second conductive trenches 60, 62 extend through the pre-metal dielectric layer 22 until they electrically contact the first and second conductive paths 54, 56, respectively.

In a way similar to what has been described with reference to FIGS. 1-4, according to one aspect, the epitaxial layer 6 houses, in a region 6', one or more electronic components, in particular designed and coupled to one another to form an electronic circuit 8. The region 6' is a region that extends over the cavity 18 (i.e., the region 6' and the cavity 18 are superimposed on one another in top plan view). The electronic components that form the electronic circuit 8 may include active components such as transistors (e.g., MOS transistors, DMOS transistors, VDMOS transistors, trench-MOS transistors, bipolar transistors, etc.), or else passive components such as resistors and/or diodes, or in general any other electronic component. Electrical-connection paths 10 (just one of which is illustrated in the figures) form respective electrical paths for supplying/picking up electrical signals to/from the electronic circuit 8. The region that houses the electronic circuit 8 is an active region of the die 100, occurring in which are phenomena of transport and conduction of electric charge.

In use, the first conductive region 44 has the function of first plate of the capacitor 40, which may be biased at a working voltage V1 by the first conductive trench 60, the first conductive path 54 coupled thereto, and the first electrical path 50. The second conductive region 48 has the function of second plate of the capacitor 40, which may be biased at a respective working voltage V2 by the second conductive trench 62, the second conductive path 56 coupled thereto, and the second electrical path 52. The dielectric region 46 arranged between the first and second conductive regions 44, 48 performs the function of dielectric arranged between the plates of the capacitor thus formed.

FIGS. 6-14 show, in the same lateral sectional view as that of FIG. 1, steps of processing of a semiconductor wafer 300 that lead to formation of the die 100.

With reference to FIG. 6, the semiconductor substrate 2 made, for example, of doped silicon, is provided as described previously.

Then (FIGS. 7A-10), steps of formation of the buried cavity (designated by the reference number 18 in FIG. 10) are carried out, for example according to the method of creation of buried cavities described in U.S. Pat. No. 8,173,513 (incorporated by reference).

For this purpose (FIG. 7A), an etch mask 60 is formed on the surface 2a of the substrate 2, made, for example, of silicon oxide. Alternatively, the mask may be a photolithographic mask, of photoresist. The mask 60 is defined so as to provide a plurality of openings 60' in the region where the buried cavity 18 is to be formed.

Figure 7B:
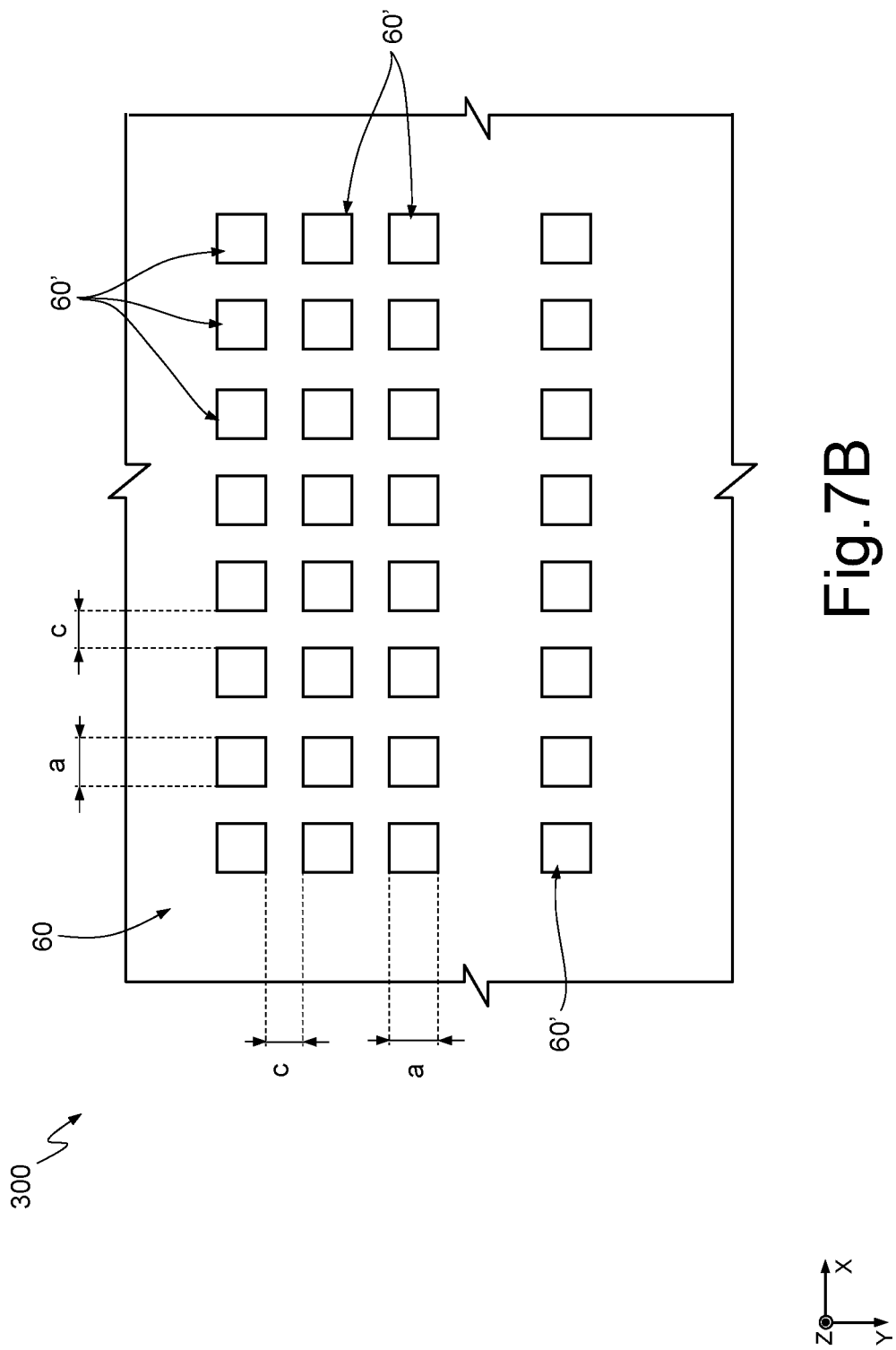
Figure 12:
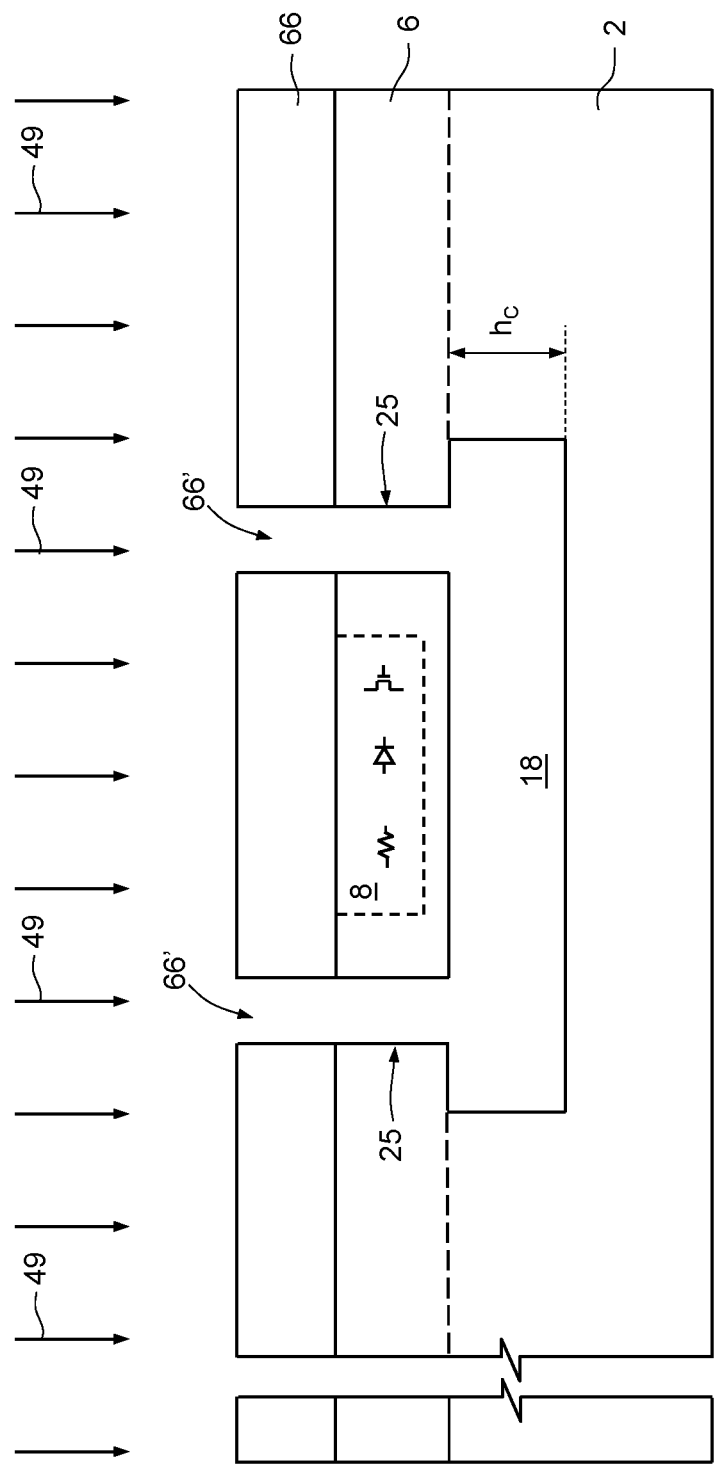

FIG. 7B shows, in top plan view in the plane XY, the portion of the photolithographic mask 60 including the openings 60'. In this example, the openings 60' have, by way of example, a quadrangular shape, for example a square shape with side "a" comprised between 0.5 µm and 3 µm, and form an array of openings in which each opening 60' is arranged at a distance "c" from an immediately adjacent opening comprised between 0.5 µm and 3 µm.

It is, however, evident that the openings 60' may have a shape and/or spatial arrangement different from the one illustrated in FIG. 7B (for example, they may be circular or generically polygonal).

Next (FIG. 8), an etching step is carried out, for example dry RIE, for selective removal of portions of the substrate 2 exposed through the openings 60' of the mask 60. During etching, portions of the semiconductor substrate 2 not protected by the mask 60 are removed, and etching proceeds until a desired depth, for example comprised between 0.5 µm and 5 µm, is reached (depth along Z measured starting from the surface 2a).

Then, the etch mask 60 is removed. Trenches 62 are thus formed in the substrate 2.

In one embodiment, each trench 62 has a square shape, in top plan view in the plane XY, with side "a" of a value substantially defined by the openings 60' of the etch mask 60, comprised between 0.5 µm and 3 µm, and a depth, measured along Z starting from the surface 2a of the substrate 2, of a value comprised between 0.5 µm and 5 µm. Each trench 62 is separated from another adjacent trench 62, along X, by walls or columns 64 of a thickness "c" comprised between 0.5 µm and 3 µm.

According to what is described with reference to FIGS. 7A-8, the trenches 62 that, in subsequent steps, will concur in formation of a buried cavity, are provided exclusively in the substrate 2. In this case, also the buried cavity 18 will be formed substantially in the substrate 2. In the case where the buried cavity were to be formed at a height, along Z, greater than the thickness of the substrate 2, it is possible to carry out, prior to the step of FIG. 7A, an epitaxial growth (in a way not illustrated in the figure).

With reference to FIG. 9, an epitaxial growth is carried out in deoxidizing environment (typically, in an atmosphere having a high hydrogen concentration, preferably using trichlorosilane—$SiHCl_3$). Consequently, an epitaxial layer 6, here having the first conductivity, grows on the silicon columns 64 and closes the trenches 62 at the top, trapping in the trenches 62 the gas present in the epitaxial-growth reactor (here, hydrogen molecules—$H_2$). The thickness of the epitaxial layer 6 is made of some microns, for example between 0.5 µm and 3 µm.

An annealing step is then carried out, for example for 30 min at 1190° C. The annealing step causes (FIG. 10) migration of the silicon atoms, which tend to move into the position of lower energy, in a per se known manner, as, for example, discussed in the paper by T. Sato, N. Aoki, I. Mizushima and Y. Tsunashima, "A New Substrate Engineering for the Formation of Empty Space in Silicon (ESS) Induced by Silicon Surface Migration", IEDM 1999, pp. 517-520 (incorporated by reference).

Consequently, in the area of the trenches 62 where the silicon columns 64 are close to one another, the silicon atoms migrate completely and form the buried cavity 18, closed at the top by the epitaxial layer 6. Preferably, the previous annealing step is carried out in $H_2$ atmosphere so as to prevent the hydrogen present in the trenches 62 from escaping through the epitaxial layer 6 outwards and so as to increase the concentration of hydrogen present in the buried cavity 18 in the case where the hydrogen trapped during the step of epitaxial growth were not sufficient. Alternatively, annealing may be carried out in a nitrogen environment.

Formation of a buried cavity 18 may likewise be carried out according to other processes of a known type, for example, as described in the scientific paper by Tsutomu Sato, et al., "Fabrication of Silicon-on-Nothing Structure by Substrate Engineering Using the Empty-Space-in-Silicon Formation Technique", Japanese Journal of Applied Physics, Vol. 43, No. 1, 2004, pp. 12-18 (incorporated by reference). The method described in the aforementioned scientific paper by Tsutomu Sato, et al. specify some parameters useful for setting the depth at which the buried cavity is formed.

According to a further embodiment, the buried cavity 18 may likewise be formed according to the process described in the paper by S. Armbruster et al., "A novel micromachining process for the fabrication of monocrystalline Si-membranes using porous silicon", TRANSDUCERS'03, The 12th International Conference on Solid State Sensors, Actuators and Microsystems, Boston, Jun. 8-12, 2003, Vol. 1, pp. 246-249 (incorporated by reference).

Irrespective of the embodiment chosen for the formation of the buried cavity 18, process steps, in themselves known, are then carried out as illustrated in FIG. 11, for the formation of one or more electronic components integrated in the epitaxial layer 6, which form the aforementioned electronic circuit 8. The electronic circuit 8 is created at portions of the epitaxial layer 6 that extend above the buried cavity 18. The steps of formation of the electronic circuit 8 may include steps of deposition of semiconductor material, implantations of dopant species, lithographic and etching steps, etc.

Then (FIG. 12), a step is carried out of formation and photolithographic definition of an etch mask 66, having openings 66' corresponding to regions where the trenches 25 that reach the buried cavity 18, thus arranging it in communication with the external environment, are to be formed. The etch mask 66 protects, in this step and in the subsequent steps, the underlying electronic circuit 8.

By way of example, the openings 66' of the etch mask 66 extend, in view in the plane XY, so as to implement one of the embodiments of FIGS. 3A-3C, or another embodiment provided by the present disclosure. In view in the plane XZ, the openings 66' extend, along Z, above the cavity 18.

Further, according to a further aspect of the present disclosure, the size of the openings 66' may be selected so that the aspect ratio of the trenches 62 (ratio between the depth of the trenches 62 and their maximum width) is equal to 2 or higher than 2, for example comprised between 2 and 50.

In detail, the trenches 25 are provided by wet or dry etching of the wafer 300 (represented schematically, in FIG. 12, by arrows 49), for selective removal of exposed portions of the epitaxial layer 6, until the buried cavity 18 is reached. The trenches 25 are formed in peripheral regions of the buried cavity 18, at a sufficient distance from the electronic circuit 8 so as not to jeopardize operation or structural integrity thereof. The epitaxial layer 6 (here of monocrystalline silicon) may be removed by an etching chemistry with a base of Sulphur hexafluoride ($SF_6$) and octafluorocyclobutane ($C_4F_8$). Other etching chemistries may be used, according to the need.

The etch mask 66 may then be removed from the wafer 300.

Next (FIG. 13), a step of at least partial filling of the buried cavity 18 is carried out to provide a plate 20 of the capacitor 1 and the dielectric 21, according to one of the embodiments of FIGS. 1, 2, and 4. A similar procedure is carried out to provide the capacitor 40 of FIG. 5.

For this purpose, according to one aspect of the present disclosure, the wafer 300 is arranged in a deposition reactor, in particular a reactor configured to carry out atomic-layer deposition (ALD), and ALD of dielectric material, for example $Al_2O_3$, $TiO_2$, $GeO_2$, $Si_3N_4$, $La_2O_3$, is carried out to form the dielectric layer 21 described previously. The ALD technique enables a uniform deposition of the dielectric inside the cavity 18 and along the walls of the trenches 25. The deposition parameters envisage a temperature comprised between 100° C. and 500° C.

As an alternative to the ALD step, it is possible to form the dielectric layer 21 by a step of thermal growth of silicon oxide.

Then, a step is carried out of deposition, for example by CVD, of polysilicon (in this example, with a doping of an N type) or of metal material such as tungsten (W) or titanium (Ti) or copper (Cu), to form the buried conductive region 20. By adjusting the deposition parameters, in particular by selecting a temperature comprised between 100° C. and 500° C., it has been found that the conductive material chosen penetrates into the trenches 25 and deposits on the side walls, top wall, and bottom wall of the buried cavity 18, to form a filling layer that coats the inner walls of the buried cavity 18 completely. At the same time, the conductive material coats the walls of the trenches 25, to form an electrical path in contact with the buried conductive region in the cavity 18. The process of deposition of conductive material continues until the trenches 25 are completely filled.

The dielectric layer 21 has likewise the function of protective barrier against diffusion of conductive species (in particular metal) of the buried conductive region 20 within the substrate 2 and the epitaxial layer 6.

With the previous steps, respective dielectric and conductive layers are formed on the top surface 6a of the epitaxial layer 6. A subsequent step of photolithographic definition of said layers at the top surface 6a of the epitaxial layer 6 enables formation of the conductive paths 28 and of the underlying dielectric layer 29 of FIGS. 1-4.

The step previously described of deposition of the buried conductive region 20 by CVD may be replaced, or integrated, with a step of deposition by ALD technique, which may be used for covering more complex geometries, such as possible corners of the buried cavity and/or for deposition of metal materials with high conductivity (aluminum, copper, etc.).

Next (FIG. 14), the pre-metal dielectric (PMD) layer 22 is formed, for example by depositing silicon oxide, on the front of the wafer 300, i.e., on the epitaxial layer 6 and on the conductive paths 28. The pre-metal dielectric layer 22 is selectively removed, by known lithographic and etching steps, to form one or more trenches 71 (just one of which is illustrated in the figure), which, once filled with conductive material, form the respective electrical paths 10 previously described for electrical contact of specific portions of the electronic circuit 8. Simultaneously, one or more further trenches 72 are formed, which, once filled with conductive material, will form the conductive trenches 32 of FIGS. 1-4. Likewise, in this step, also the conductive trench 36 of FIG. 4 may simultaneously be formed.

Filling of the trenches 71 and 72 is carried out, for example, by CVD, depositing metal material, in particular tungsten, aluminum, or copper.

Likewise, the back contact 34 is formed according to the embodiments of FIGS. 1 and 2.

Figure 13:
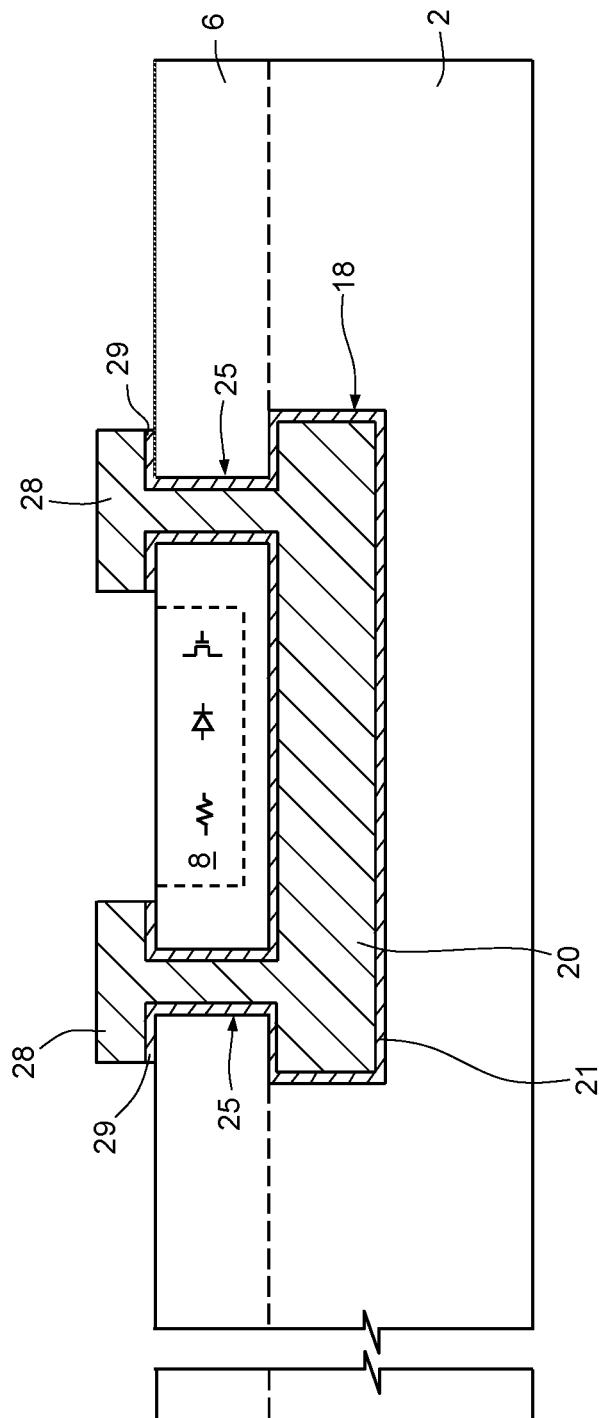
Figure 14:
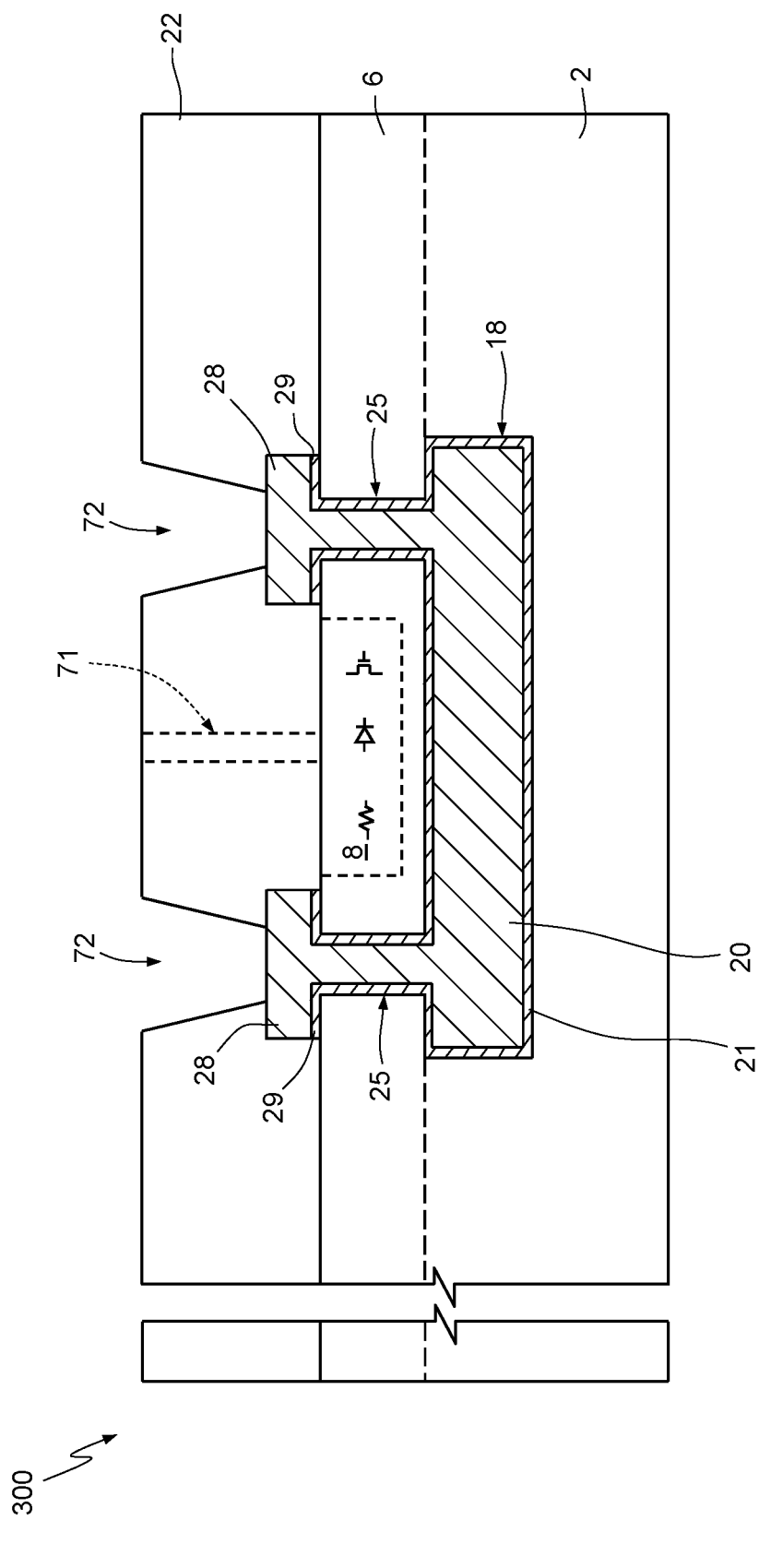

The steps for the production of the capacitor 40 of FIG. 5 are similar to those described previously, with the appropriate variants for filling of the buried cavity 18. In detail, after the step of FIG. 12, a series of steps of thermal oxidation and/or CVD/ALD are carried out to form in succession the insulating region 42, the first conductive region 44, the dielectric 46, and the second conductive region 48. Then, the steps described with reference to FIGS. 13 and 14 are carried out.

From what has been described above, the advantages of the invention illustrated, in the various embodiments, are evident.

For instance, the manufacturing process described envisages formation of a buried cavity in a monolithic semiconductor body, without the need to carry out bonding operations. The structural stability is thus improved, and the manufacturing costs are reduced. Further, the semiconductor body 2, which would otherwise have an exclusive function of structural support, is exploited actively.

Further, the value of density of capacitance per unit area of the embedded capacitor according to the various embodiments of the present invention is high, in particular higher than the typical value of MIM capacitors (e.g., approximately twice, i.e., 10000 pF/mm$^2$).

Finally, it is evident that modifications and variations may be made to the invention described, without departing from the scope of the present disclosure, as defined in the annexed claims.

For instance, the first conductivity may be of an N type, and the second conductivity may be of a P type.

Further, the electronic circuit 8 may not be present, or may be formed in an area of the die 100 different from the one illustrated in the figures, for example laterally staggered, in top plan view, with respect to the cavity 18.

The invention claimed is:

1. An integrated circuit, comprising:
   a semiconductor substrate;
   an epitaxial semiconductor layer over the semiconductor substrate;
   wherein the semiconductor substrate includes a cavity which is covered by the epitaxial semiconductor layer, said cavity including an upper wall provided by a bottom surface of the epitaxial semiconductor layer, a lower wall, and sidewalls;
   an insulating layer lining the upper wall, the lower wall and the sidewalls of the cavity;
   a first conductive material lining the insulating layer along the upper wall, the lower wall and the sidewalls of the cavity;
   a capacitor dielectric layer lining surfaces of the first conductive material along the upper wall, the lower wall and the sidewalls of the cavity;
   a second conductive material lining surfaces of the capacitor dielectric layer along the upper wall, the lower wall and the sidewalls of the cavity,
   wherein the first conductive material forms a first plate of a capacitor and the second conductive material forms a second plate of the capacitor.

2. The integrated circuit of claim 1, further comprising:
   a first electrical contact insulated from and extending through the epitaxial semiconductor layer to make an electrical connection with the first conductive material; and
   a second electrical contact insulated from and extending through the epitaxial semiconductor layer to make an electrical connection with the second conductive material.

3. The integrated circuit of claim 2, wherein the first conductive material and the first electrical contact are made of a same material and form a continuous path.

4. The integrated circuit of claim 2, wherein the second conductive material and the second electrical contact are made of a same material and form a continuous path.

5. The integrated circuit of claim 1, further comprising an electronic circuit in the epitaxial semiconductor layer in a region extending over the cavity.

6. The integrated circuit of claim 1, wherein the first conductive material is made of a material selected from the group consisting of a doped polysilicon, a metal, and a metal alloy.

7. The integrated circuit of claim 1, wherein the second conductive material is made of a material selected from the group consisting of a doped polysilicon, a metal, and a metal alloy.

8. The integrated circuit of claim 1, wherein the second conductive material surrounds a hollow portion within the cavity.

9. An integrated circuit, comprising:
   a semiconductor substrate;
   an epitaxial semiconductor layer over the semiconductor substrate;
   wherein the semiconductor substrate includes a cavity which is covered by the epitaxial semiconductor layer;
   a capacitor located within said cavity, wherein said capacitor comprises:
     a first conductive material within said cavity forming a first capacitor electrode, the first conductive material having a first top surface, a first bottom surface and first side surfaces;
     a capacitor dielectric layer surrounding said first conductive material on the first top surface, first bottom surface and first side surfaces, the capacitor dielectric layer having a second top surface, a second bottom surface and second side surfaces;
     a second conductive material surrounding the capacitor dielectric layer on the second top surface, second bottom surface and second side surfaces, the second conductive material having a third top surface, a third bottom surface and third side surfaces; and
     an insulating layer surrounding the second conductive material on the third top surface, third bottom surface and third side surfaces, the insulating layer in contact with a fourth top surface, a fourth bottom surface and fourth side surfaces of the cavity; and
   first and second openings extending through the epitaxial semiconductor layer to the cavity, wherein the first conductive material, the capacitor dielectric layer, the second conductive material and the insulating layer extend through the first and second openings.

10. The integrated circuit of claim 9, wherein the first conductive material surrounds a hollow portion within the cavity.

11. The integrated circuit of claim 9, further comprising an electronic circuit in the epitaxial semiconductor layer in a region extending over the cavity and between the first and second openings.

12. The integrated circuit of claim 9, wherein the first conductive material is made of a material selected from the group consisting of a doped polysilicon, a metal, and a metal alloy.

13. The integrated circuit of claim 9, wherein the second conductive material is made of a material selected from the group consisting of a doped polysilicon, a metal, and a metal alloy.

* * * * *